US012802937B2

(12) United States Patent
Wang et al.

(10) Patent No.: US 12,802,937 B2
(45) Date of Patent: Nov. 17, 2026

(54) METHODS AND APPARATUS FOR PROCESSING A SUBSTRATE

(71) Applicant: Applied Materials, Inc., Santa Clara, CA (US)

(72) Inventors: Rongping Wang, Cupertino, CA (US); Andy Mo, San Jose, CA (US); Junwei Shangguan, Xi'an (CN)

(73) Assignee: APPLIED MATERALS, INC.

( * ) Notice: Subject to any disclaimer, the term of this patent is extended or adjusted under 35 U.S.C. 154(b) by 85 days.

(21) Appl. No.: 18/768,326

(22) Filed: Jul. 10, 2024

(65) Prior Publication Data

US 2025/0364216 A1 Nov. 27, 2025

(30) Foreign Application Priority Data

May 24, 2024 (WO) ................ PCT/CN2024/095193

(51) Int. Cl.
*H01J 37/32* (2006.01)

(52) U.S. Cl.
CPC .. *H01J 37/32183* (2013.01); *H01J 37/32174* (2013.01)

(58) Field of Classification Search
None
See application file for complete search history.

(56) References Cited

U.S. PATENT DOCUMENTS 5,572,170 A * 11/1996 Collins ............. H01J 37/32183 257/E21.252
6,174,450 B1 * 1/2001 Patrick .............. H01J 37/32082 438/10
6,242,360 B1 6/2001 Fischer et al.
6,313,584 B1 11/2001 Johnson et al.
7,042,311 B1 * 5/2006 Hilliker ............. H01J 37/32183 333/133
8,975,981 B2 3/2015 See et al.
9,401,264 B2 7/2016 Marakhtanov et al.
10,663,491 B2 * 5/2020 Ye ......................... G01R 15/181
10,770,267 B1 * 9/2020 Kartashyan ....... H01J 37/32183
11,361,941 B2 * 6/2022 Kim .................. H01J 37/32183
11,773,484 B2 * 10/2023 Zhao ....................... C23C 16/26 427/577
11,984,297 B2 * 5/2024 Oh .................... H01J 37/32183
11,990,318 B2 * 5/2024 Yamazawa ........ H01J 37/32183
12,106,938 B2 * 10/2024 Guo .................. H01J 37/32146
2002/0100422 A1 * 8/2002 Hilliker ............. H01J 37/32174 156/345.48
2005/0235916 A1 * 10/2005 Juco .................. H01J 37/32082 118/723 I (Continued)

OTHER PUBLICATIONS

International Search Report for PCT/CN2024/095193, dated Jan. 6, 2025.

*Primary Examiner* — Srinivas Sathiraju
(74) *Attorney, Agent, or Firm* — Moser Taboada

(57) ABSTRACT

Methods and apparatus for processing a substrate are herein described. For example, a processing system for processing a substrate comprises a chamber body defining a processing volume, a radio frequency (RF) power source configured to generate RF energy, an impedance matching network configured to optimize delivery of the RF energy to a plasma in the processing volume, and an RF filter connected between the radio frequency (RF) power source and the matching network via an RF cable.

20 Claims, 3 Drawing Sheets

(56) References Cited

U.S. PATENT DOCUMENTS

| | | | | |
|---|---|---|---|---|
| 2006/0000805 | A1* | 1/2006 | Todorow | C23F 4/00 216/68 |
| 2014/0162462 | A1 | 6/2014 | Trachuck et al. | |
| 2018/0231587 | A1* | 8/2018 | Ye | G01R 15/181 |
| 2019/0244788 | A1* | 8/2019 | Marakhtanov | H01J 37/3299 |
| 2019/0341227 | A1* | 11/2019 | Thokachichu | H01J 37/32082 |
| 2019/0341232 | A1* | 11/2019 | Thokachichu | H01J 37/32082 |
| 2020/0294769 | A1* | 9/2020 | Pratt | H01J 37/32183 |
| 2020/0411288 | A1* | 12/2020 | Wang | H01J 37/32935 |
| 2021/0029815 | A1* | 1/2021 | Bowman | H01J 37/32082 |
| 2021/0375601 | A1* | 12/2021 | Gopalan | H01J 37/32357 |
| 2021/0375701 | A1* | 12/2021 | Gopalan | H01J 37/32935 |
| 2021/0398778 | A1* | 12/2021 | Kim | H01J 37/32183 |
| 2021/0404055 | A1* | 12/2021 | Zhao | C23C 16/26 |
| 2022/0037121 | A1* | 2/2022 | Dorf | H01J 37/32128 |
| 2022/0108874 | A1* | 4/2022 | Nagorny | H01J 37/32422 |
| 2022/0148854 | A1 | 5/2022 | Yamazawa | |
| 2022/0270856 | A1* | 8/2022 | Poulose | H01J 37/32183 |
| 2022/0270857 | A1* | 8/2022 | Poulose | H01J 37/32183 |
| 2022/0406567 | A1* | 12/2022 | Yang | H01J 37/32128 |
| 2023/0052543 | A1* | 2/2023 | Linebarger, Jr. | H01J 37/32522 |
| 2023/0091161 | A1* | 3/2023 | Oh | H01J 37/32183 315/111.21 |
| 2023/0170190 | A1* | 6/2023 | Thokachichu | H01J 37/32082 156/345.48 |
| 2023/0343555 | A1* | 10/2023 | Guo | H01J 37/32146 |
| 2024/0145216 | A1* | 5/2024 | Bhutta | H01J 37/32128 |
| 2025/0364216 | A1* | 11/2025 | Wang | H01J 37/32174 |

* cited by examiner

300

| | | | | | | | | | | | | | | | | |
|---|---|---|---|---|---|---|---|---|---|---|---|---|---|---|---|---|
| Cable Length (ft) | 67 | 69 | 71 | 73 | 75 | 77 | 79 | 81 | 83 | 85 | 87 | 89 | 91 | 93 | 95 | 97 |
| Power system & plasma | UNSTABLE | | | | | | | | | | | UNSTABLE | | | STABLE | |
| Cable Length (ft) | 67 | 69 | 71 | 73 | 75 | 77 | 79 | 81 | 83 | 85 | 87 | 89 | 91 | | | |
| With Filter Region 1 | UNSTABLE | | | | 302 STABLE | | | | UNSTABLE | | | | | | | |
| Cable Length (ft) | 92 | 94 | 96 | 98 | 100 | 102 | 104 | 106 | 108 | 110 | 112 | 114 | 116 | | | |
| With Filter Region 2 | UNSTABLE | | | | 304 STABLE | | | | | UNSTABLE | | | | | | |
| Cable Length (ft) | 117 | 119 | 121 | 123 | 125 | 127 | 129 | 131 | 133 | 135 | 137 | 139 | 141 | | | |
| With Filter Region 3 | UNSTABLE | | | | 306 STABLE | | | | | | UNSTABLE | | | | | |

METHODS AND APPARATUS FOR PROCESSING A SUBSTRATE

CROSS-REFERENCE TO RELATED APPLICATIONS

The present application claims priority to International Patent Application Serial No. PCT/CN2024/095193, filed on May 24, 2024, the entire contents of which is incorporated herein by reference.

FIELD

Embodiments of the present disclosure generally relate to a methods and apparatus for processing a substrate, and more particularly, to methods and apparatus configured to stabilize RF power delivery to a plasma load.

BACKGROUND

Plasma processing chambers for processing a substrate are known, but substrate processing with plasma is becoming more and more challenging. For example, during plasma processing, plasma instability and loss of process power control often occurs. For example, during etch processes, e.g., with electronegative gases, plasma can sometimes oscillate when a power supply (RF power supply) is operating at relatively low, but uncontrollable frequencies and magnitudes, which can result in power delivery not meeting a setpoint and higher reflected power and can cause process shifting and repeatability issues. In severe cases, the etch process may never reach a steady state. Conventional methods/apparatus for plasma instability and loss of process power control adjust an RF cable that connects the RF power supply and the matching network. For example, the RF cable length can be adjusted to rotate load impedance into a stable range (e.g., a window) that favors power supply. For some processes, however, the window for the cable length adjustment can be very narrow or even non-existing, and considering tool and process variations, one cable length may work for one chamber but not for another chamber.

Accordingly, the inventors provide herein improved methods and apparatus configured to stabilize RF power delivery to a plasma load.

SUMMARY

Methods and apparatus for processing a substrate are provided herein. In accordance with at least some embodiments, a processing system for processing a substrate comprises a chamber body defining a processing volume, a radio frequency (RF) power source configured to generate RF energy, an impedance matching network configured to optimize delivery of the RF energy to a plasma in the processing volume, and an RF filter connected between the radio frequency (RF) power source and the matching network via an RF cable.

In accordance with at least some embodiments, a processing system for processing a substrate comprises a chamber body defining a processing volume, a radio frequency (RF) power source configured to generate RF energy, an impedance matching network configured to optimize delivery of the RF energy to a plasma in the processing volume, and an RF filter connected between the radio frequency (RF) power source and the impedance matching network via an RF cable and configured to maintain control of power delivery from the radio frequency (RF) power source to the chamber body by providing an impedance at oscillation frequencies from about 0.1 kHz to about 1 MHz to create a process window with stable plasma and controllable power delivery during operation.

In accordance with at least some embodiments, a processing system for processing a substrate comprises a chamber body defining a processing volume, a radio frequency (RF) power source configured to generate RF energy, an impedance matching network configured to optimize delivery of the RF energy to a plasma in the processing volume, and an RF filter connected between the radio frequency (RF) power source and the impedance matching network via an RF cable and configured to set an impedance at oscillation frequencies to allow power at process frequency to pass while minimizing loss via blocking unwanted perturbations to create a process window with stable plasma and controllable power delivery during operation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
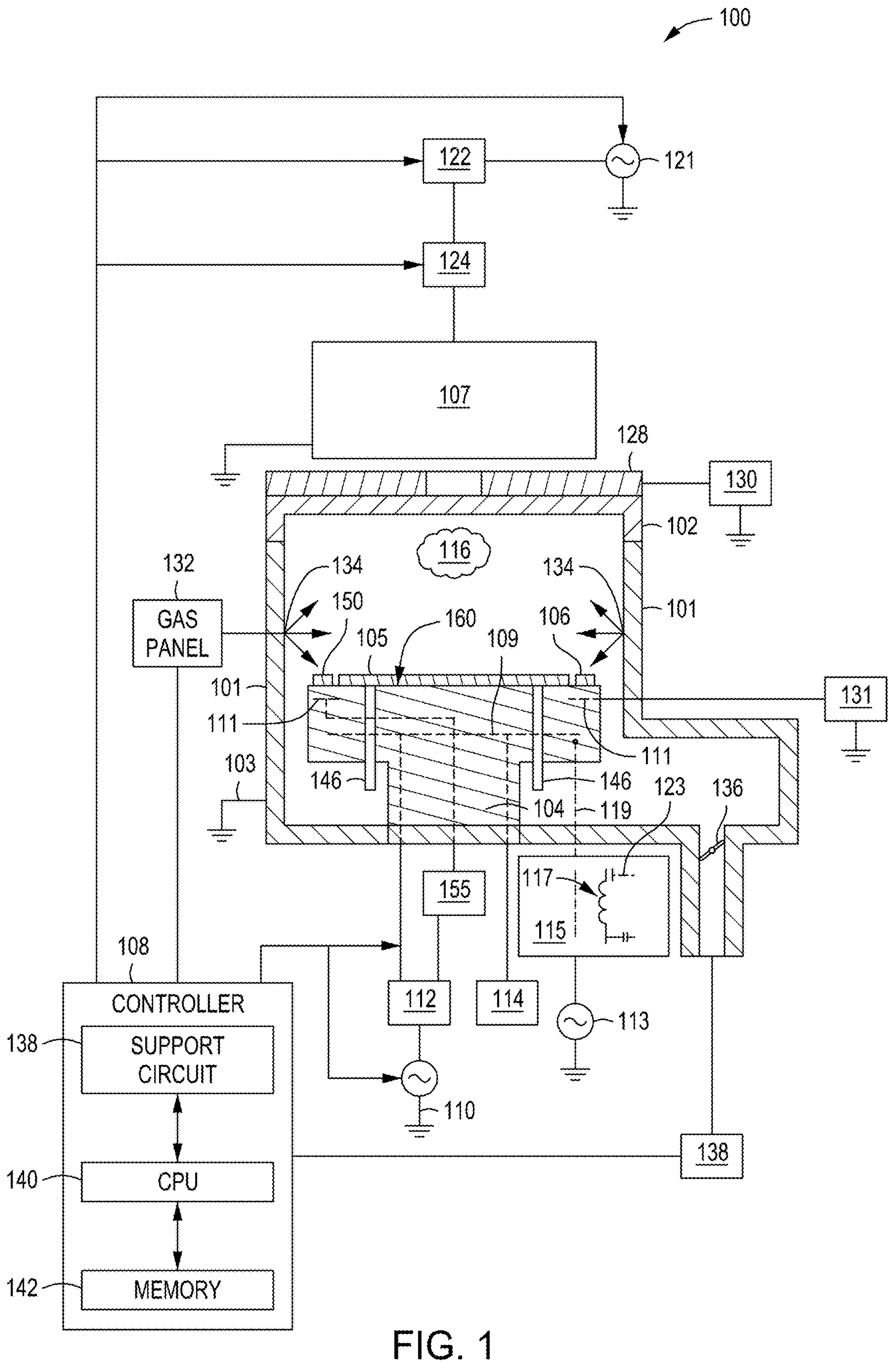
FIG. 1 is a cross-sectional schematic view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, the methods and apparatus described herein are configured to stabilize RF power delivery to a plasma load for improving controllability of steady processes. For example, a processing system for processing a substrate can comprise a chamber body defining a processing volume. A radio frequency (RF) power source can be configured to generate RF energy. An impedance matching network can be configured to optimize delivery of the RF energy to a plasma in the processing volume. An RF filter can be connected between the radio frequency (RF) power source and the matching network via an RF cable. Unlike conventional methods and apparatus, the inventive concepts described herein use one or more types of RF filters to actively block unwanted oscillations, and the RF filters can expand plasma stability and a controllable power window operation (e.g., window for a steady state). For example, in at least some embodiments, the window for a steady state can be increased to accommodate RF cable lengths adjusted from about 2' to about 12', which provides a user with opportunities in adoption of new low cost and high efficiency RF power supplies.

FIG. 1 is a schematic sectional view of a processing chamber 100 (e.g., a processing system), according to one example of the disclosure. The processing chamber 100 includes a chamber body 101 and a lid 102 disposed thereon that together define an inner volume. The chamber body 101 is typically coupled to an electrical ground 103.

The processing chamber 100 can be one of an inductively coupled plasma (ICP) chamber, and/or a capacitively coupled plasma (CCP) chamber. For example, in at least some embodiments, the processing chamber 100 is a chamber including a ICP apparatus 107 on top. In at least some embodiments, the top of the processing chamber 100 can be grounded. The ICP apparatus 107 generates a plasma of reactive species (e.g., for one or more types of dry etch processes) within the processing chamber 100, and a controller 108 (e.g., a system controller) is adapted to control systems and subsystems of the processing chamber 100, as described in greater detail below.

The ICP apparatus 107 is disposed above the lid 102 and is configured to capacitively couple RF power into the processing chamber 100 to generate a plasma 116 within the processing chamber 100. The ICP apparatus 107 can be adjusted as desired to control the profile or density of the plasma 116 being formed. The ICP apparatus 107 is coupled to an RF power supply 121 through an impedance matching network 122 via an RF feed structure 124. The RF power supply 121 may illustratively be capable of producing up to about 60,000 W (but not limited to about 60,000 W) at a tunable frequency in a range from 50 kHz to 150 MHZ, although other frequencies and powers may be utilized as desired for particular applications.

In some examples, a power divider (not shown), such as a dividing capacitor, may be provided between the RF feed structure 124 and the RF power supply 121 to control the relative quantity of RF power provided. For example, in embodiments when processing chamber 100 includes an ICP apparatus, the power divider may be used. In such embodiments, the power divider may be incorporated into the impedance matching network 122.

A heater element 128 may be disposed on the lid 102 to facilitate heating the interior of the processing chamber 100. The heater element 128 may be disposed between the lid 102 and a plasma apparatus, such as the ICP apparatus 107. In some examples, the heater element 128 may include a resistive heating element and may be coupled to a power supply 130, such as an AC power supply, configured to provide sufficient energy to control the temperature of the heater element 128 within a desired range, as described in greater detail below.

A substrate support assembly 104 is disposed within the inner volume to support a substrate 105 thereon during processing (use). An edge ring 106 is positioned around a periphery of the substrate 105 on the substrate support assembly 104. The edge ring 106 is disposed on and surrounds a substrate support surface of an ESC.

The substrate support assembly 104 includes one or more electrodes, such as a first electrode 109 and a second electrode, such as a ring electrode 111 surrounding the first electrode 109. The first electrode 109 is coupled to a chucking power source 114 to facilitate chucking of the substrate 105 to the upper surface 160 during processing.

An AC power supply 113 is configured to supply power to the processing chamber 100 for energizing one or more components associated therewith. Unlike RF power sources, which operate at much higher frequencies (e.g., 13.56 MHz) and require matching circuits for impedance matching, the AC power supply 113 operates at much lower frequencies and don't require such matching circuits. For example, the AC power supply 113 can be configured, for example, to supply 110*v* or 220*v* at one or more suitable frequencies. For example, in at least some embodiments, the AC power supply 113 can be configured to supply up to 220 v at 50 Hz or 60 Hz and around 40 amps to the processing chamber 100.

In at least some embodiments, a DC power source 131 can be connected to the substrate support assembly 104 (e.g., to the ring electrode 111) and configured to provide a clamping force to clamp the edge ring 106 to the substrate support (e.g., to a ceramic ring 250 disposed on the substrate support as described below), e.g., to improve thermal control of the edge ring 106, during operation.

The first electrode 109 and the ring electrode 111 are each coupled to the RF power source 110 providing one or more frequencies through an impedance matching network 112 (similar to the impedance matching network 122) and the edge tuning circuit 155 (e.g., hereinafter simply referred to as an edge tuning circuit 155) including variable capacitors and inductors. The impedance matching network 112 ensures that the output of the RF power source 110 is effectively coupled to the plasma to maximize the energy coupled to the plasma. The impedance matching network 112 typically matches 50 ohms to the complex impedance of the plasma. To facilitate dynamic matching as the plasma characteristics change during processing, the impedance matching network 112 can be adjusted as needed to ensure that a match is maintained throughout the process. The impedance matching network 122 is configured and operates similarly with respect to the RF energy provided by the RF power supply 121. For example, the impedance matching network 122 is configured to optimize delivery of the RF energy to a plasma in the processing volume.

The edge tuning circuit 155 is an RF circuit that operates near resonance which enables adjusting a voltage higher or/and lower than a source voltage. The RF power source 110 is utilized to bias the substrate 105 disposed on an upper surface 160 of the substrate support assembly 104. The RF power source 110 may illustratively be a source of up to about 10,000 W (but not limited to about 10,000 W) of RF energy, which may be provided at one or multiple frequencies, such as 400 kHz, 2 MHz, 13.56 MHz, 27 MHz, 40 MHz, or 60 MHz. The RF power source 110 can include two or more independent RF power sources that are configured to provide RF energy at two or more corresponding frequencies. For example, in at least some embodiments, the RF power source 110 can include a first RF power source and a second RF power source each configured to provide RF energy at a corresponding frequency, e.g., 400 kHz and 2 MHZ, and an optional third RF power source can be provided and can be configured to provide RF energy at a frequency of 400 kHz, 2 MHz, and/or 40 MHz. The RF power source 110 may be capable of producing either or both of continuous or pulsed power.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the processing chamber 100 by applying power from the RF power supply 121 to the ICP apparatus 107. In some examples, power from the RF power source 110 may also be provided through the impedance matching network 112 to the first electrode 109 and/or the edge ring 106 within the substrate support assembly 104. Alternatively or additionally, power from the RF power source 110 may also be provided through the impedance matching network 112 to a baseplate and/or other electrode within the substrate support assembly 104.

The pressure within the interior of the processing chamber 100 may be controlled using a valve 136 and a vacuum pump 138. The temperature of the chamber body 101 may be controlled using fluid-containing conduits (not shown) that run through the chamber body 101.

The processing chamber 100 includes the controller 108 to control the operation of the processing chamber 100 during processing. The controller 108 comprises a CPU 140 (central processing unit), a memory 142 (e.g., non-transitory computer readable storage medium), and support circuits 144 for the CPU 140 and facilitates control of the components of the processing chamber 100. The controller 108 may be one of any form of general-purpose computer processor that can be used in an industrial setting for controlling various chambers and sub-processors. The memory 142 stores software (source or object code) that may be executed or invoked to control the operation of the processing chamber 100 in the manner described herein. For example, during processing, the software of the memory 142 comprises the instructions for manipulating various RF circuits provided herein to monitor an RF voltage indirectly induced by the RF power source 110 at an input of an RF filter circuit and determine a processing state in the processing volume based on the RF voltage, as described in greater detail below.

An RF filter circuit 115 (e.g., a low pass filter) is connected between an electrode (e.g., a heater) and the AC power supply 113. The RF filter circuit 115 includes one or more electrical elements including, but not limited to, resistors, inductors, capacitors, and the like. For example, in at least some embodiments, the RF filter circuit 115 includes a combination inductor and capacitor 117 connected in series (e.g., a shunt capacitor) that are configured as a low pass frequency filter on an AC power supply transmission line 119, e.g., to block one or more of the frequencies that the RF power source 110 is configured to operate at. For example, some of the frequencies that can be blocked by the low pass frequency filter can include, but are not limited to, 400 kHz or greater, 2 MHz or greater, 13.56 MHz or greater, 27 MHz or greater, 40 MHz or greater, or 60 MHz or greater, or the like. The RF filter circuit 115 also includes one or more capacitive coupling ports that are capacitively coupled to the AC power supply transmission line 119. For example, in at least some embodiments, the RF filter circuit 115 includes a capacitive coupling port 123. The capacitive coupling port 123 can have any suitable capacitive coupling power. For example, in at least some embodiments, the capacitive coupling port 123 can have a capacitive coupling power of about −40 dB to about −47 dB.

As noted above, conventional methods/apparatus for plasma instability and loss of process power control are configured to adjust an RF cable length to rotate load impedance into a stable range that favors power supply. Such methods/apparatus, however, depend on whether a plasma stability and controllable power window (e.g., for a steady state) exists and how broad the window is (a duration of the window. Accordingly, the inventors describe herein a filter that allows RF power of process frequency to pass to the process chamber without loss and blocks unwanted perturbations. The filter actively intervenes in power delivery and provides high impedance (blocks) at oscillation (e.g., lower) frequencies.

Figures 2, 3:
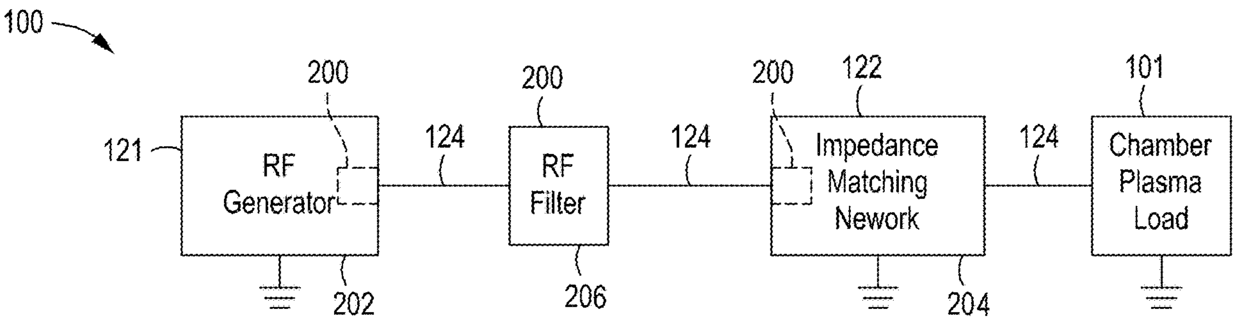
FIG. 2 is a block diagram of the processing chamber of FIG. 1, in accordance with at least some embodiments of the present disclosure.
FIG. 3 is a table illustrating power system and plasma stability and cable length, in accordance with at least some embodiments of the present disclosure.

FIG. 2 is a block diagram of the processing chamber of FIG. 1, in accordance with at least some embodiments of the present disclosure. A filter 200 is provided between the RF power supply 121 (e.g., an RF power source) and the impedance matching network 122 via an RF feed structure 124 that connects to the chamber body 101 of the processing chamber 100. In at least some embodiments, the filter 200 can be disposed at one of directly at an output of the radio frequency (RF) power source or directly at an input of the matching network (e.g., impedance matching network), shown in phantom. In at least some embodiments, the RF power source can be in a first enclosure 202, the impedance matching network can be in a second enclosure 204, and the RF filter can be in a third enclosure 206 separate from the first enclosure and the second enclosure. Alternatively, the RF power source, the impedance matching network, and the RF filter can be in the same enclosure.

Unlike the RF filter circuit 115, which is a low pass filter, the filter 200 can be a high-pass or a band-pass filter that is configured to prevent or control dP/dZ types of oscillation between the plasma 116 and RF power supply 121 (e.g., a radio frequency (RF) power source). When the filter 200 is the high-pass filter, the high-pass filter can be a Chebyshev high-pass filter of $3^{rd}$ order or higher, with a characteristic impedance of 50Ω. In such embodiments, the RF filter can have a 3 dB-point between the process frequency and 1 MHZ, e.g. at about 3.7 MHz while operating at a process frequency of about 13 MHz.

The filter 200 can be configured to maintain control of power delivery from the RF power supply 121 to the processing chamber 100 by providing an impedance at oscillation frequencies (e.g., from about 0.1 kHz to about 1 MHZ). In doing so, a process window with stable plasma and controllable power delivery can be created during operation, which, as noted above, can be particularly useful in addressing narrow or even near-zero process windows with traditional cable length adjustment methods. In at least some embodiments, the filter 200 can be configured for use with processing systems configured for use with etch processes, e.g., with electronegative gases. In at least some embodiments, the RF filter can be configured to couple to an RF cable to increase the size of a stability window from about 2' to about 12' to compensate for $d_P/d_Z$ type of oscillations between the plasma and the radio frequency (RF) power source and create the process window with stable plasma and controllable power delivery during operation.

FIG. 3 is a table illustrating power system and plasma stability and cable length, in accordance with at least some embodiments of the present disclosure. For example, as illustrated FIG. 3, power system and plasma associated with conventional process systems (e.g., plasma process systems, such as etch process systems) without a filter 200 as described herein can have a plasma stability window of about 2' wide, see reference number 300 for example. Conversely, the filter 200 can create a wider process window with stable plasma and controllable power delivery. For example, using the filter 200, the process window can be increased to 8' to 12'—which is about ⅓ to ½ of the total phase angle around a Smith chart—see 302, which represents 8', see 304, which represents 10', see 306, which represents 12'.

Figure 4:
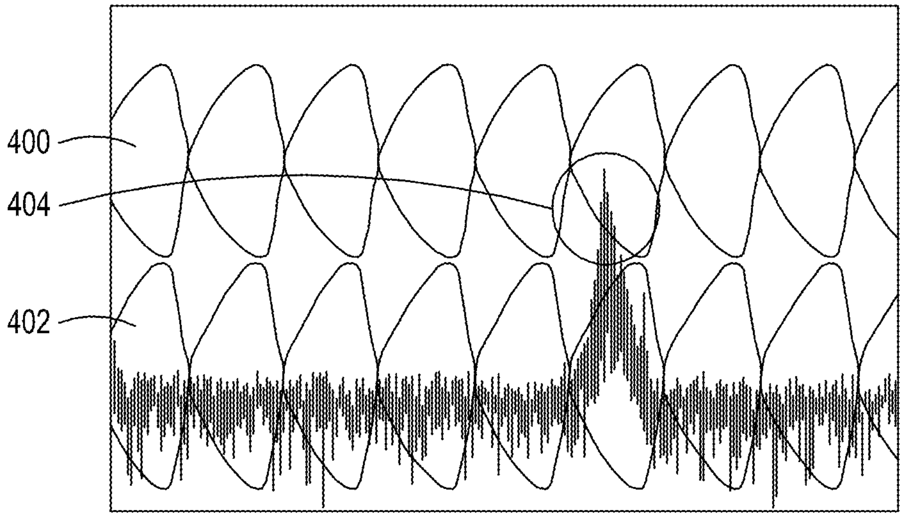
FIG. 4 is a graph of plasma instability as indicated by RF voltage and current waveforms that are measured by voltage and current probes, and one spectrum of the waveforms, in accordance with at least some embodiments of the present disclosure.
Figure 5:
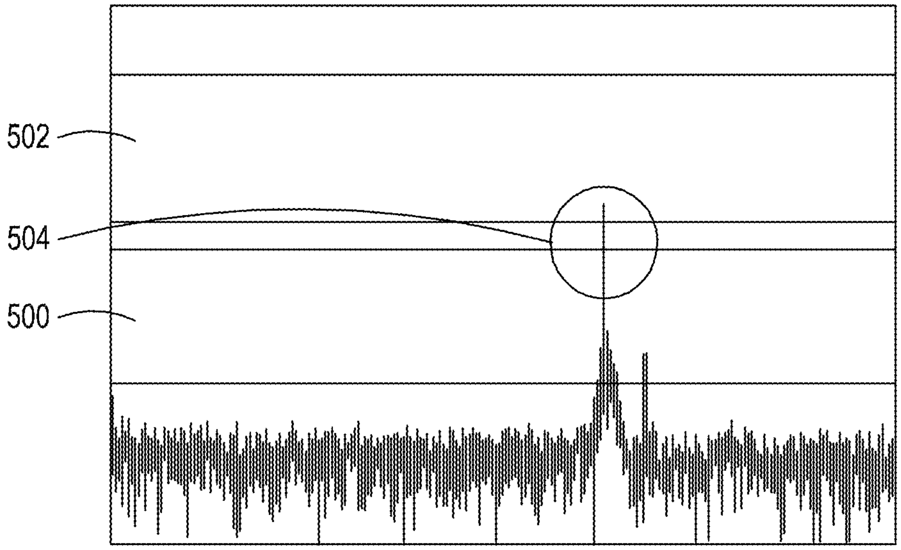
FIG. 5 is a graph of plasma stability as indicated by RF voltage and current waveforms that are measured by voltage and current probes, and one spectrum of the waveforms, in accordance with at least some embodiments of the present disclosure.

FIG. 4 is a graph of plasma instability as indicated by RF voltage and current waveforms that are measured by voltage and current probes, and one spectrum of the waveforms, and FIG. 5 is a graph of plasma stability as indicated by RF voltage and current waveforms that are measured by voltage and current probes, and one spectrum of the waveforms, in accordance with at least some embodiments of the present disclosure. FIG. 4 illustrates RF voltage and current waveforms and the RF voltage and current spectrums, without the filter 200. The oscillation between plasma and power supply is about 100 kHz, wherein the trace 400 and the trace 402 respectively represent RF voltage and current waveform envelops. Likewise, the trace 500 and the trace 502 respectively represent RF voltage and current waveforms and the RF voltage and current spectrums. As illustrated in FIGS. 4 and 5, with the filter 200, the envelopes of RF current and voltage are relatively flat and indicate a steady process condition (cf. compare the trace 400 and the trace 402 with the trace 500 and the trace 502). Additionally, the Fourier spectrum shows a very clean frequency peak 504 at 12.56 MHZ, as opposed to the frequency peak with significant side bands 404 at 12.56 MHz of FIG. 4.

While the foregoing is directed to embodiments of the present disclosure, other and further embodiments of the disclosure may be devised without departing from the basic scope thereof.

The invention claimed is:

1. A processing system for processing a substrate, comprising:
- a chamber body defining a processing volume;
- a radio frequency (RF) power source configured to generate RF energy;
- an impedance matching network configured to optimize delivery of the RF energy to a plasma in the processing volume; and
- an RF filter connected between the radio frequency (RF) power source and the impedance matching network via an RF cable,
- wherein the RF filter is configured to couple to the RF cable to increase a size of a stability window from about 2' to about 12' to compensate for $d_P/d_Z$ type of oscillations between the plasma and the radio frequency (RF) power source and create a process window with stable plasma and controllable power delivery during operation.

2. The processing system of claim 1, wherein:
- the RF power source is in a first enclosure;
- the impedance matching network is in a second enclosure; and
- the RF filter is in a third enclosure separate from the first enclosure and the second enclosure.

3. The processing system of claim 1, wherein the RF filter is a plurality of filters with different filter types that are configured to actively block the oscillations.

4. The processing system of claim 1, wherein the RF filter is one of a high-pass filter or a band-pass filter.

5. The processing system of claim 4, wherein the high-pass filter is a Chebyshev high-pass filter of $3^{rd}$ or higher order.

6. The processing system of claim 1, wherein the RF filter is configured to compensate for $d_P/d_Z$ type of oscillations between the plasma and the radio frequency (RF) power source with power delivery at frequencies from about 0.1 kHz to about 1 MHz.

7. The processing system of claim 1, wherein the RF filter has a 3 dB-point between 1 MHz and process frequency.

8. The processing system of claim 1, wherein the processing system is an inductively coupled plasma chamber or a capacitively coupled plasma chamber.

9. The processing system of claim 1, wherein the RF filter is disposed at one of directly at an output of the radio frequency (RF) power source or directly at an input of the impedance matching network.

10. The processing system of claim 1, wherein the RF filter is configured for use with processing systems that are configured to perform an etch process with electronegative gases.

11. A processing system for processing a substrate, comprising:
- a chamber body defining a processing volume;
- a radio frequency (RF) power source configured to generate RF energy;
- an impedance matching network configured to optimize delivery of the RF energy to a plasma in the processing volume; and
- an RF filter connected between the radio frequency (RF) power source and the impedance matching network via an RF cable and configured to maintain control of power delivery from the radio frequency (RF) power source to the chamber body by providing an impedance at oscillation frequencies from about 0.1 KHz to about 1 MHz,
- wherein the RF filter is configured to couple to the RF cable to increase a size of a stability window from about 2' to about 12' to compensate for $d_P/d_Z$ type of oscillations between the plasma and the radio frequency (RF) power source and create a process window with stable plasma and controllable power delivery during operation.

12. The processing system of claim 11, wherein:
- the RF power source is in a first enclosure;
- the impedance matching network is in a second enclosure; and
- the RF filter is in a third enclosure separate from the first enclosure and the second enclosure.

13. The processing system of claim 11, wherein the RF filter is one of a high-pass filter or a band-pass filter.

14. The processing system of claim 13, wherein the RF filter is the high-pass filter, and wherein the high-pass filter is a Chebyshev high-pass filter of $3^{rd}$ or higher order.

15. The processing system of claim 11, wherein the RF filter is configured to compensate for $d_P/d_Z$ type of oscillations between the plasma and the radio frequency (RF) power source with power delivery at frequencies from about 1 kHz to about 100 kHz.

16. The processing system of claim 11, wherein the RF filter has a 3 dB-point between 1 MHz and process frequency.

17. The processing system of claim 11, wherein the processing system is an inductively coupled plasma chamber or a capacitively coupled plasma chamber.

18. The processing system of claim 11, wherein the RF filter is disposed at one of directly at an output of the radio frequency (RF) power source or directly at an input of the impedance matching network.

19. The processing system of claim 11, wherein the RF filter is configured for use with processing systems that are configured to perform an etch process with electronegative gases.

20. A processing system for processing a substrate, comprising:

a chamber body defining a processing volume;

a radio frequency (RF) power source configured to generate RF energy;

an impedance matching network configured to optimize delivery of the RF energy to a plasma in the processing volume; and an RF filter connected between the radio frequency (RF) power source and the impedance matching network via an RF cable and configured to set an impedance at oscillation frequencies to allow power at process frequency to pass while minimizing loss via blocking unwanted perturbations, wherein the RF filter is configured to couple to the RF cable to increase a size of a stability window from about 2' to about 12' to compensate for $d_P/d_Z$ type of oscillations between the plasma and the radio frequency (RF) power source and create a process window with stable plasma and controllable power delivery during operation.

* * * * *